(12) United States Patent
Takata et al.

(10) Patent No.: US 6,400,602 B2
(45) Date of Patent: Jun. 4, 2002

(54) SEMICONDUCTOR MEMORY DEVICE AND RESTORATION METHOD THEREFOR

(75) Inventors: Hidekazu Takata; Kengo Maeda, both of Nara; Yasumichi Mori, Ikoma, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/818,194

(22) Filed: Mar. 26, 2001

(30) Foreign Application Priority Data

Mar. 31, 2000 (JP) ........................................ 2000-099937

(51) Int. Cl.[7] .............................................. G11C 16/06

(52) U.S. Cl. ............................ 365/185.09; 365/185.11; 365/200

(58) Field of Search ..................... 365/185.33, 230.01, 365/239, 230.03, 200, 210, 185.28, 185.09, 185.11, 185.14

(56) References Cited

U.S. PATENT DOCUMENTS 4,866,676 A * 9/1989 Crisp et al. ................. 365/200
6,141,267 A * 10/2000 Kirihata et al. ........ 365/185.09

FOREIGN PATENT DOCUMENTS

JP 09-007390 1/1997
JP 11-162193 6/1999

* cited by examiner

Primary Examiner—David Nelms
Assistant Examiner—Thong Le
(74) Attorney, Agent, or Firm—Morrison & Foerster LLP

(57) ABSTRACT

A semiconductor memory device includes: a plurality of memory cell regions, each comprising at least one memory cell; a non-volatile memory section which accepts external writing; and unselecting means for designating at least one of the plurality of memory cell regions to be inaccessible based on data written to the non-volatile memory section. At least one operation type is performed for at least one accessible memory cell region, which is not designated to be inaccessible, among the plurality of memory cell regions.

12 Claims, 13 Drawing Sheets

Row Address; 11bit=2048
Block Address; 4bit=16
Column Address; 4bit=16
Input/Output bit; 16 lines=16
8M bit=2048×16×16×16

FIG. 4A

| Normally-functioning bits | External Address Z[3:0] 3210 | Internal Address 3210 |
|---|---|---|
| 0.5M Block0 | 0000 | 0000 |
| 1M Block1 | 0001 | 0001 |
| 1.5M Block2 | 0010 | 0010 |
| 2M Block3 | 0011 | 0011 |
| 2.5M Block4 | 0100 | 0100 |
| 3M Block5 | 0101 | 0101 |
| 3.5M Block6 | 0110 | 0110 |
| 4M Block7 | 0111 | 0111 |
| 4.5M Block8 | 1000 | 1000 |
| 5M Block9 | 1001 | 1001 |
| 5.5M Block10 | 1010 | 1010 |
| 6M Block11 | 1011 | 1011 |
| 6.5M Block12 | 1100 | 1100 |
| 7M Block13 | 1101 | 1101 |
| 7.5M Block14 | 1110 | 1110 |
| 8M Block15 | 1111 | 1111 |

Normal region (8M)

FIG. 4B

| Normally-functioning bits | External Address Z[3:0] 3210 | Internal Address 3210 |
|---|---|---|
| 0.5M Block0 | 0000 | 0000 |
| 1M Block1 | 0001 | 0001 |
| 1.5M Block2 | 0010 | 0010 |
| 2M Block3 | 0011 | 0011 |
| 2.5M Block4 | 0100 | 0100 |
| 3M Block5 | 0101 | 0101 |
| 3.5M Block6 | 0110 | * |
| 4M Block7 | 0111 | 0111 |
| 4.5M Block8 | 1000 | 1000 |
| 5M Block9 | 1001 | 1001 |
| 5.5M Block10 | 1010 | 1010 |
| 6M Block11 | 1011 | 1011 |
| 6.5M Block12 | 1100 | 1100 |
| 7M Block13 | 1101 | 1101 |
| 7.5M Block14 | 1110 | 1110 |
| 8M Block15 | * | 1111 |

Normal region (7.5M)

Defective region (0.5M)

Defective Address (inaccessible block)

Z Address "+1"

Consecutive external Addresses are supplied

These addresses are shifted by a circuit which increments addresses by "+1"

Addresses are shifted because actual internal addresses are not consecutive. 7M bits are available in total

FIG. 6A

| Normally-functioning bits | External Address | | Internal Address |
|---|---|---|---|
| | Z[3:0],Y[2:0] | Z[3210],Y[210] | Z[3210],Y[210] |
| 0.5M | Block0 | 0000,*** | 0000,*** |
| 1M | Block1 | 0001,*** | 0001,*** |
| 1.5M | Block2 | 0010,*** | 0010,*** |
| 2M | Block3 | 0011,*** | 0011,*** |
| 2.5M | Block4 | 0100,*** | 0100,*** |
| 3M | Block5 | 0101,*** | 0101,*** |
| 3.5M | Block6 | 0110,*** | 0110,*** |
| 4M | Block7 | 0111,*** | 0111,*** |
| 4.5M | Block8 | 1000,*** | 1000,*** |
| 5M | Block9 | 1001,*** | 1001,*** |
| 5.5M | Block10 | 1010,*** | 1010,*** |
| 6M | Block11 | 1011,*** | 1011,*** |
| 6.5M | Block12 | 1100,*** | 1100,*** |
| 7M | Block13 | 1101,*** | 1101,*** |
| 7.5M | Block14 | 1110,*** | 1110,*** |
| 7M+64k bit | Block15 | 1111,000 | 1111,000 |
| 7M+128k bit | Block16 | 1111,001 | 1111,001 |
| 7M+192k bit | Block17 | 1111,010 | 1111,010 |
| 7M+256k bit | Block18 | 1111,011 | 1111,011 |
| 7M+320k bit | Block19 | 1111,100 | 1111,100 |
| 7M+384k bit | Block20 | 1111,101 | 1111,101 |
| 7M+448k bit | Block21 | 1111,110 | 1111,110 |
| 8M | Block22 | 1111,111 | 1111,111 |

Normal region 512k bit Block
Normal region 64k bit Block

□ 512k bit Block
▨ 64k bit Block

FIG. 6B

| Normally-functioning bits | External Address | | Internal Address |
|---|---|---|---|
| | Z[3:0],Y[2:0] | Z[3210],Y[210] | Z[3210],Y[210] |
| 0.5M | Block0 | 0000,*** | 0000,*** |
| 1M | Block1 | 0001,*** | 0001,*** |
| 1.5M | Block2 | 0010,*** | 0010,*** |
| 2M | Block3 | 0011,*** | 0011,*** |
| 2.5M | Block4 | 0100,*** | 0100,*** |
| 3M | Block5 | 0101,*** | 0101,*** |
| 3.5M | Block6 | 0110,*** | 0110,*** |
| 4M | Block7 | 0111,*** | 0111,*** |
| 4.5M | Block8 | 1000,*** | 1000,*** |
| 5M | Block9 | 1001,*** | 1001,*** |
| 5.5M | Block10 | 1010,*** | 1010,*** |
| 6M | Block11 | 1011,*** | 1011,*** |
| 6.5M | Block12 | 1100,*** | 1100,*** |
| 7M | Block13 | 1101,*** | 1101,*** |
| 7.5M | Block14 | 1110,*** | 1110,*** |
| 7M+64k bit | Block15 | 1111,000 | 1111,000 |
| 7M+128k bit | Block16 | 1111,001 | 1111,001 |
| 7M+192k bit | Block17 | 1111,010 | ※ ← Defective Address |
| 7M+256k bit | Block18 | 1111,011 | 1111,010 |
| 7M+320k bit | Block19 | 1111,100 | 1111,011 |
| 7M+384k bit | Block20 | 1111,101 | 1111,100 |
| 7M+448k bit | Block21 | 1111,110 | 1111,101 |
| 8M | Block22 | 1111,111 | 1111,110 |

Normal region 512k bit Block
Normal region 64k bit Block
Defective region (0.5M)

Y Address "+1"
Defective Address

□ 512k bit Block
▨ 64k bit Block

FIG. 7

| Normally-functioning bits | Z[3:0],Y[3:0] | External Address Z[3210],Y[210] | Internal Address Z[3210],Y[210] |
|---|---|---|---|
| 8M | Block22 | 1111,*** | 0000,*** |
| 7.5M | Block21 | 1110,*** | 0001,*** |
| 7M | Block20 | 1101,*** | 0010,*** |
| 6.5M | Block19 | 1100,*** | 0011,*** |
| 6M | Block18 | 1011,*** | 0100,*** |
| 5.5M | Block17 | 1010,*** | 0101,*** |
| 5M | Block16 | 1001,*** | 0110,*** |
| 4.5M | Block15 | 1000,*** | 0111,*** |
| 4M | Block14 | 0111,*** | 1000,*** |
| 3.5M | Block13 | 0110,*** | 1001,*** |
| 3M | Block12 | 0101,*** | 1010,*** |
| 2.5M | Block11 | 0100,*** | 1011,*** |
| 2M | Block10 | 0011,*** | 1100,*** |
| 1.5M | Block9 | 0010,*** | 1101,*** |
| 1M | Block8 | 0001,*** | 1110,*** |
| 512k bit | Block7 | 0000,111 | 1111,000 |
| 448k bit | Block6 | 0000,110 | 1111,001 |
| 384k bit | Block5 | 0000,101 | 1111,010 |
| 320k bit | Block4 | 0000,100 | 1111,011 |
| 256k bit | Block3 | 0000,011 | 1111,100 |
| 192k bit | Block2 | 0000,010 | 1111,101 |
| 128k bit | Block1 | 0000,001 | 1111,110 |
| 64k bit | Block0 | 0000,000 | 1111,111 |

Normal region 512k bit Block (Blocks 8–22)
Normal region 64k bit Block (Blocks 0–7)

☐ 512k bit Block
▦ 64k bit Block

FIG. 10A

| Normally-functioning bits | | External Address | | Internal Address | |
|---|---|---|---|---|---|
| | | Z[3:0] | 3210 | | 3210 |
| Normal region Bank A (6M) | 0.5M | Block0 | 0000 | → | 0000 |
| | 1M | Block1 | 0001 | → | 0001 |
| | 1.5M | Block2 | 0010 | → | 0010 |
| | 2M | Block3 | 0011 | → | 0011 |
| | 2.5M | Block4 | 0100 | → | 0100 |
| | 3M | Block5 | 0101 | → | 0101 |
| | 3.5M | Block6 | 0110 | → | 0110 |
| | 4M | Block7 | 0111 | → | 0111 |
| | 4.5M | Block8 | 1000 | → | 1000 |
| | 5M | Block9 | 1001 | → | 1001 |
| | 5.5M | Block10 | 1010 | → | 1010 |
| | 6M | Block11 | 1011 | → | 1011 | Bank A
| Normal region Bank B (2M) | 6.5M | Block12 | 1100 | → | 1100 | Bank B
| | 7M | Block13 | 1101 | → | 1101 |
| | 7.5M | Block14 | 1110 | → | 1110 |
| | 8M | Block15 | 1111 | → | 1111 |

FIG. 10B

| | Normally-functioning bits | External Address | | Internal Address | |
|---|---|---|---|---|---|
| | | Z[3:0] | 3210 | | 3210 |
| Normal region Bank A (5.5M) | 0.5M | Block0 | 0000 | → | 0000 |
| | 1M | Block1 | 0001 | → | 0001 |
| | 1.5M | Block2 | 0010 | → | 0010 |
| | 2M | Block3 | 0011 | → | 0011 |
| | 2.5M | Block4 | 0100 | → | 0100 |
| | 3M | Block5 | 0101 | → | 0101 |
| | 3.5M | Block6 | 0110 | ↘ | * | ← Defective Address (Inaccessible Block)
| | 4M | Block7 | 0111 | ↘ | 0111 |
| | 4.5M | Block8 | 1000 | ↘ | 1000 | Z Address "+1"
| | 5M | Block9 | 1001 | ↘ | 1001 |
| Defective region (0.5M) | 5.5M | Block10 | 1010 | ↘ | 1010 |
| | 6M | Block11 | 1011 | ↘ | 1011 |
| Normal region Bank B (1.5M) | 6.5M | Block12 | 1100 | → | 1100 |
| | 7M | Block13 | 1101 | ↘ | * | ← Defective Address (Inaccessible Block)
| | 7.5M | Block14 | 1110 | ↘ | 1110 | Z Address "+1"
| Defective region (0.5M) | 8M | Block15 | * | ↘ | 1111 |

Consecutive external Addresses are supplied

Addresses are shifted because actual internal addresses are not consecutive.
7M bits are available in total

SEMICONDUCTOR MEMORY DEVICE AND RESTORATION METHOD THEREFOR

BACKGROUND OF THE INVENTION

1. Field of the Invention

The present invention relates to a semiconductor memory device, such as a non-volatile semiconductor memory device, e.g., a flash memory, an FRAM (a type of a ferroelectric memory device) and an MRAM (a type of a magnetic memory device), or a volatile semiconductor memory device which includes a non-volatile memory region; and a method for restoring such a semiconductor memory device having any defective memory cells.

2. Description of the Related Art

Unlike volatile memories such as DRAMs (dynamic random access memories) and SRAMs (static random access memories), whose data will be reset when the power supply to the memory devices is stopped, non-volatile semiconductor memory devices (which may simply be referred to as "non-volatile memories") can retain data in memory cells thereof even after the power supply thereto is stopped. Examples of non-volatile memories include flash memories (which are in wide use, e.g., in cellular phones), FRAMs (which are used in IC cards, etc.), and MRAMs which are under vigorous development. The description in the present specification will chiefly deal with flash memories as exemplary non-volatile memories.

In general, semiconductor memory devices are produced through a minute fine semiconductor process. Therefore, there may always be a certain percentage of defective memory cells included in semiconductor memory devices. Therefore, it has been conventional practice to provide a number of extra or reserve memory cells in the semiconductor memory device, in addition to the regular memory cells, and replace defective memory cells with such reserve memory cells. Thus, the semiconductor memory device including defective memory cells, which would otherwise have been discarded, can be "restored".

However, in order to avoid increase in the chip size, there can only be so many reserve memory cells provided in a semiconductor memory device. Hence, under circumstances where only a small resource can be allocated for the reserve memory cells, any chips which cannot be restored even by using reserve memory cells must be discarded as defective chips.

Several methods have been proposed to enable restoration of those chips which cannot be restored by the use of reserve memory cells. According to such methods, those chips which would otherwise be discarded as defective chips are relabeled as smaller-capacity semiconductor memory devices, in which any defective memory cell regions are prevented from being accessed.

For example, in the field of volatile memories, Japanese Laid-Open Patent Publication No. 11-162193 proposes a method which involves selecting only normal memory cell blocks by cutting a fuse with a laser means or the like. In the field of non-volatile memories, Japanese Laid-Open Patent Publication No. 9-7390 proposes a method which involves storing any cell information to be relocated in a non-volatile memory cell which is separately prepared in addition to regular memory cells, and selecting only the normal memory cell blocks.

However, the aforementioned conventional methods for restoring a semiconductor memory device including defective memory cells amount to, at best, simply "unselecting" a given address so as to convert what was originally an x Mbit capacity to a much reduced capacity of x/2 Mbits or $x/2^n$ Mbits (where n=a positive integer). Therefore, even if one defective memory cell is contained in the entire semiconductor memory device, the overall capacity of the semiconductor memory device is reduced to ½, ¼, ⅛, etc., thereby wasting a large number of normally-functioning memory cells.

Moreover, the aforementioned conventional methods cannot be employed to restore semiconductor memory devices having a multi-block configuration, in which a plurality of blocks having different capacities are provided within the semiconductor memory device, or a bank configuration (which has gradually been becoming a mainstream in flash memories in recent years), which allows a read operation to be performed during a program or erase operation.

Furthermore, with any of the aforementioned conventional methods, a semiconductor memory device including a defective memory cell cannot be restored in such a manner as to allow defective memory cell regions to accept only limited types of operations which are determined in accordance with the defect mode.

SUMMARY OF THE INVENTION

According to one aspect of the present invention, there is provided a semiconductor memory device including: a plurality of memory cell regions, each including at least one memory cell; a non-volatile memory section which accepts external writing; and unselecting means for designating at least one of the plurality of memory cell regions to be inaccessible based on data written to the non-volatile memory section, wherein at least one operation type is performed for at least one accessible memory cell region, which is not designated to be inaccessible, among the plurality of memory cell regions.

In one embodiment of the invention, the semiconductor memory device further includes address conversion means for assigning a consecutive sequence of external addresses to the at least one accessible memory cell region.

In another embodiment of the invention, if an internal address which is generated by adding a predetermined value to an external address coincides with an existing internal address when assigning the consecutive sequence of external addresses to the at least one accessible memory cell region, one of the plurality of memory cell regions corresponding to the generated internal address is designated to be inaccessible.

In still another embodiment of the invention, based on the data written to the non-volatile memory section, the unselecting means designates at least one of the plurality of memory cell regions to be inaccessible to one operation type among the at least one operation type, and yet accessible to the other operation types among the at least one operation type.

In still another embodiment of the invention, the semiconductor memory device includes a plurality of memory cell blocks capable of accepting a block erase operation, and when designating at least one of the plurality of memory cell regions to be inaccessible based on the data written to the non-volatile memory section, the unselecting means designates at least one of the plurality of memory cell blocks to be inaccessible.

In still another embodiment of the invention, the plurality of memory cell blocks includes at least one memory cell block having a different capacity.

In still another embodiment of the invention, the semiconductor memory device includes a plurality of banks, each including the plurality of memory cell blocks, such that the plurality of memory cell blocks are capable of dual work operation, and, when designating at least one of the plurality of memory cell regions to be inaccessible based on the data written to the non-volatile memory section, the unselecting means designates at least one of the plurality of banks to be inaccessible.

In still another embodiment of the invention, at least one of the plurality of banks includes at least one memory cell block having a different capacity.

In still another embodiment of the invention, the address conversion means is capable of changing an address position of the at least one memory cell block having the different capacity.

In still another embodiment of the invention, the non-volatile memory section is provided in a portion of a non-volatile memory cell which is capable of programming at once.

According to another aspect of the present invention, there is provided a method for restoring the aforementioned semiconductor memory device when the semiconductor memory device includes a defective memory cell, including the steps of: storing an address of the defective memory cell in the non-volatile memory section; and designating, by means of the unselecting means, one of the plurality of memory cell regions that includes the defective memory cell to be inaccessible, based on the data written to the non-volatile memory section.

In one embodiment of the invention, the method further includes the step of: designating, by means of the unselecting means, one of the plurality of memory cell regions that includes the defective memory cell to be inaccessible only to an operation type which causes an error, based on the data written to the non-volatile memory section.

Thus, the invention described herein makes possible the advantages of: (1) providing a semiconductor memory device and a method for restoring the same, such that a memory containing a defective memory cell can be flexibly restored as a memory having a capacity which is reduced from the original capacity, the reduction in capacity being in accordance with the number of defective memory cells; and (2) providing a semiconductor memory device and a method for restoring the same, such that a defective memory cell contained in a memory can be allowed to accept, in the same manner as normally-functioning memory cell regions, only limited types of operations which are determined in accordance with a defect mode.

These and other advantages of the present invention will become apparent to those skilled in the art upon reading and understanding the following detailed description with reference to the accompanying figures.

BRIEF DESCRIPTION OF THE DRAWINGS

FIG. 4A is an address map showing a block structure of an 8 Mbit flash memory all of whose blocks are normally-functioning.

FIG. 4B is an address map showing a block structure of an 8 Mbit flash memory including a bit defective in one block, and how the memory is restorable by a method according to an example of the present invention.

FIG. 6A is an address map showing a block structure of an 8 Mbit flash memory, including a plurality of blocks having different capacities, where all of the blocks are normally-functioning.

FIG. 6B is an address map showing a block structure of an 8 Mbit flash memory, including a bit defective in one block, and how the memory is restorable by a method according to an example of the present invention.

FIG. 7 is an address map showing a block structure of an 8 Mbit flash memory, including a plurality of normally-functioning blocks having different capacities, where the smaller capacity blocks reside at the smaller addresses.

FIG. 10A is a block structure diagram of a normally-functioning 8 Mbit flash memory of a type having two dual-work banks.

FIG. 10B is a block structure diagram of an 8 Mbit flash memory of a type having two dual-work banks, and how the respective banks can be restored by a method according to an example of the present invention.

DESCRIPTION OF THE PREFERRED EMBODIMENTS

Figure 1:
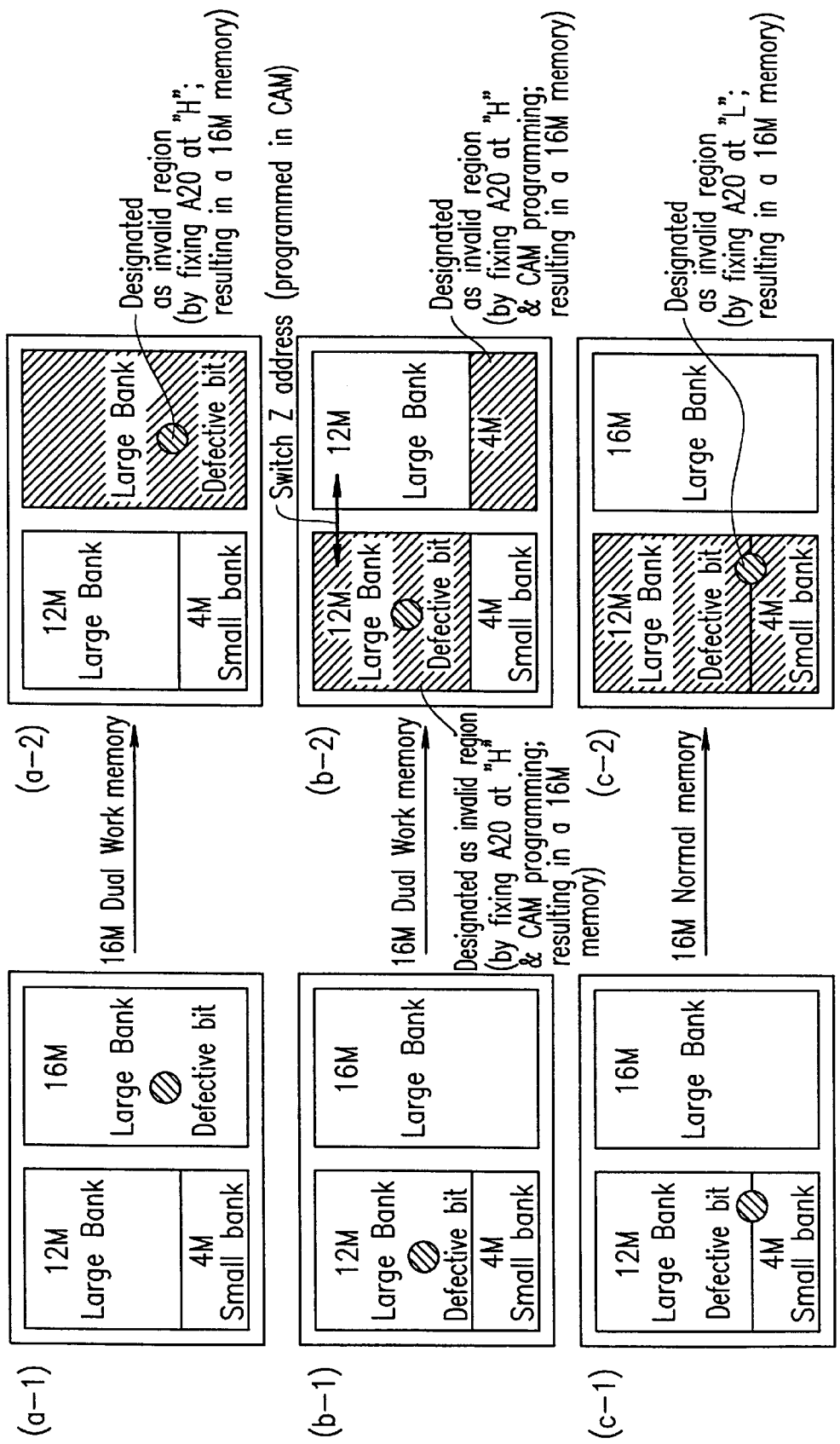
FIG. 1 is a block structure diagram of 32 Mbit flash memories of a type having two dual-work banks, and how such flash memories can be restored by a method according to an example of the present invention; (a-1) shows a flash memory having a defective bit in the right large bank, restorable as shown in (a-2); (b-1) shows a flash memory having a defective bit in the left large bank, restorable as shown in (b-2); and (c-1) shows a flash memory having a defective bit astride the left large bank and the small bank, restorable as shown in (a-2).

Hereinafter, the functions of the present invention will be described.

A semiconductor memory device according to the present invention generally includes: a memory cell section having a plurality of memory cells; and a non-volatile memory section which accepts external writing. The memory cell section can be divided into a number of memory cell regions. As used herein, a "memory cell region" may include one or more memory cells, thus corresponding to a so-called "block", "bank", or any smaller units of memory cells.

According to the present invention, an address representing a defective memory cell (or a "defective bit") is stored in the non-volatile memory section. Based on the address data stored in the non-volatile memory section, any memory cell region which contains one or more defective memory cells can be designated to be inaccessible, while the other memory region is left accessible. Accordingly, in the case where a memory cell region includes defective bits (i.e., defective memory cells), such that all of the defective bits cannot be replaced by reserve memory cells available within the semiconductor memory device, the entire memory cell region containing such defective bits is designated to be inaccessible (i.e., inactive). Thus, the resultant semiconductor memory device will have a capacity which is reduced from the original capacity by an amount corresponding to the defective memory cell regions (defective blocks, defective banks, etc.), thereby making the most use of the normally-functioning bits (i.e., normally-functioning memory cells).

Furthermore, according to the present invention, it is possible to assign a consecutive sequence of external addresses to an accessible memory cell region. As a result, even in the case where defective bits are present in discrete memory cell regions, it is still possible, after such memory cell regions are inactivated (i.e., rendered inaccessible), to access the semiconductor memory device by using a consecutive sequence of external addresses.

If an internal address which is generated by adding a predetermined value to an external address happens to be identical to another internal address, a region which is represented by that internal address can be designated to be inaccessible. Thus, it is possible to detect if external addresses will overflow (outnumber) internal addresses.

Furthermore, it is possible to designate a memory cell region to be inaccessible on an operation-by-operation basis. Specifically, a memory cell region may be rendered inaccessible to selected operations among various types of operations (e.g., read, program, and erase), while the same memory cell region is still left accessible to the other types of operations, such a selection being made in accordance with the nature of the defect (referred to as "defect mode"). For example, a block containing defective memory cells showing a defect mode such that erasure cannot be properly done, then such a block may be designated to be accessible to any operations but an erase operation. As a result, it becomes possible to utilize this block as an OTP (One Time Program) region.

The semiconductor memory device (memory) according to the present invention includes a non-volatile memory section which accepts external writing. The non-volatile memory section is used for storing an address(s) representing a defective bit or memory cell(s).

A decoder circuit may be employed which includes, for example, a plurality of CAM (Content Addressable Memory) circuits, each CAM (Content Addressable Memory) circuit corresponding to an associated block within the memory, and which determines a block that corresponds to a given input address to ensure that a "1" signal will be output to only the matched block(s). Such a decoder circuit may be employed for determining which block includes defective addresses during an initial operation test for the semiconductor memory device (chip). Specifically, the CAM circuits are arranged in such a manner that CAM data "0" will be output for any blocks including no defective bits, and that CAM data "1" will be output for any blocks including a defective bit(s). Thus, a block can be determined as defective if the decoder circuit output and the CAM data output for that block are identical (i.e., "1"). In order to render such a defective block inaccessible or "unselected", a block selection signal is not enabled, or a separately-prepared non-selection signal may be enabled. This function can be realized by using a simple NAND gate structure or the like.

Another feature made possible by the present invention is the consecutive assignment of external addresses to internal addresses on a block-by-block basis. This feature can be realized by routing any external address that corresponds to an inaccessible block to an adder circuit, where the external is incremented by "1" to give a corresponding internal address so that a next block is selected in response to the external address. If the next block includes a defective address (i.e., that block is also inaccessible), "2" must instead be added to the external address, and so forth. Thus, by preparing information (e.g., a table) of numerical values by which an external address is to be incremented, it is possible to internally designate any blocks to be inaccessible while maintaining a consecutive sequence of external addresses. Such information can be known in advance, e.g., during the aforementioned initial operation test for the chip. If the maximum incremental value is "8", which corresponds to "1000" in binary expression, CAM circuitry corresponding to four bits is required in order to store the information concerning such incremental values.

Figure 11:
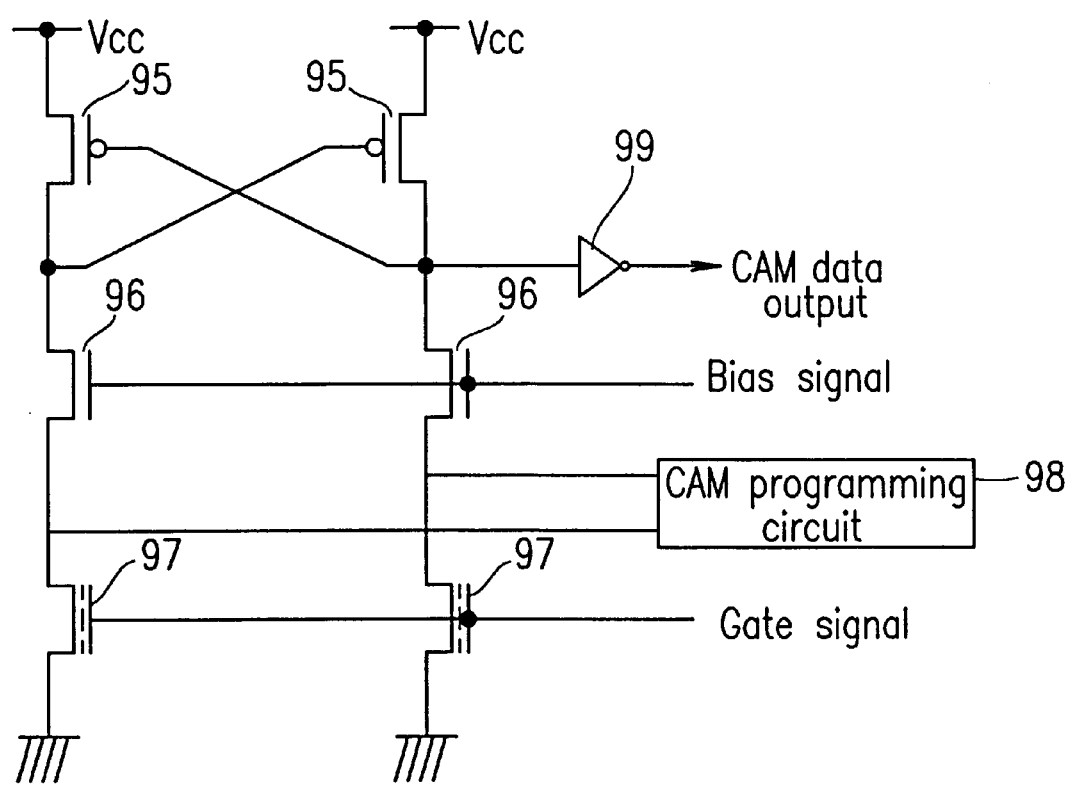
FIG. 11 is a circuit diagram showing a CAM circuit for use in the present invention.

FIG. 11 shows a CAM circuit (corresponding to one bit) in an embodiment where a cell structure similar to that of a flash memory are employed for the non-volatile memory section. The CAM circuit includes a pair of series circuits coupled between a source level VCC and a ground level. Each series circuit includes a p-channel MOSFET (metal oxide semiconductor field effect transistor) 95, an n-channel MOSFET 96, and a flash memory cell transistor 97. A gate of each MOSFET 95 is coupled to a drain of the other MOSFET 95. A bias voltage of about 2 V is applied to gates of the MOSFETs 96. A number of such non-volatile CAM circuits, corresponding to a number of bits (i.e., memory cells) in the semiconductor memory device, are provided. In accordance with this CAM circuit, it is possible to store non-volatile CAM data (corresponding to 1 bit) in the cell transistors 97, by applying a high voltage Vpp (e.g., 12 V) to control gates of the cell transistors 97 and by supplying a complementary pair of program voltages, one of which is 7 V and the other is 0 V, from a CAM programming circuit 9 to drains of the cell transistors 97. By applying the voltage Vcc to the control gates of the cell transistors 97, it is possible to read the source potential of one of the MOSFETs 95 as CAM data (corresponding to 1 bit) via an inverter 99, where the source potential of one of the MOSFETs 95 may be either the source level Vcc or the ground level in accordance with the stored content. The CAM data which has thus been read can be used to control a switching circuit.

The semiconductor memory device of the present invention includes an unselecting means for designating a memory region(s) including any defective memory cells to be inaccessible based on the data stored in the non-volatile memory section, while leaving the other regions accessible. Furthermore, it is possible to render such a memory region inaccessible to selected operations among various types of operations (e.g., read, program, and erase), while the same memory cell region is still left accessible to the other types of operations, such a selection being made in accordance with the defect mode.

For example, a CAM region may be prepared for each block for determining if that block is defective with respect to erase, program, or read operations. Suppose a block is accessible to program or read operations and only inaccessible to erase operations. Then, it is ensured that "1" will be output as CAM data associated with erase operations, whereas "0" will be output as CAM data associated with program or read operations, to which the block is still accessible. Generally, read operations and program operations for a flash memory are controlled by commands. Accordingly, an erase operation may be begun by inputting an erase command along with an address pointing to a block for which the erase operation is intended. If the input address points to a block which is accessible to erase operations, then an erase operation for that block is enabled. If the input address points to a block which is inaccessible to erase operations, then erase operations for that block are disabled.

Furthermore, by using an address conversion means, it is possible to assign a consecutive sequence of external addresses to internal addresses of normally-functioning memory cell regions. The address conversion means can be realized by an adder circuit which is described later.

Figure 12:
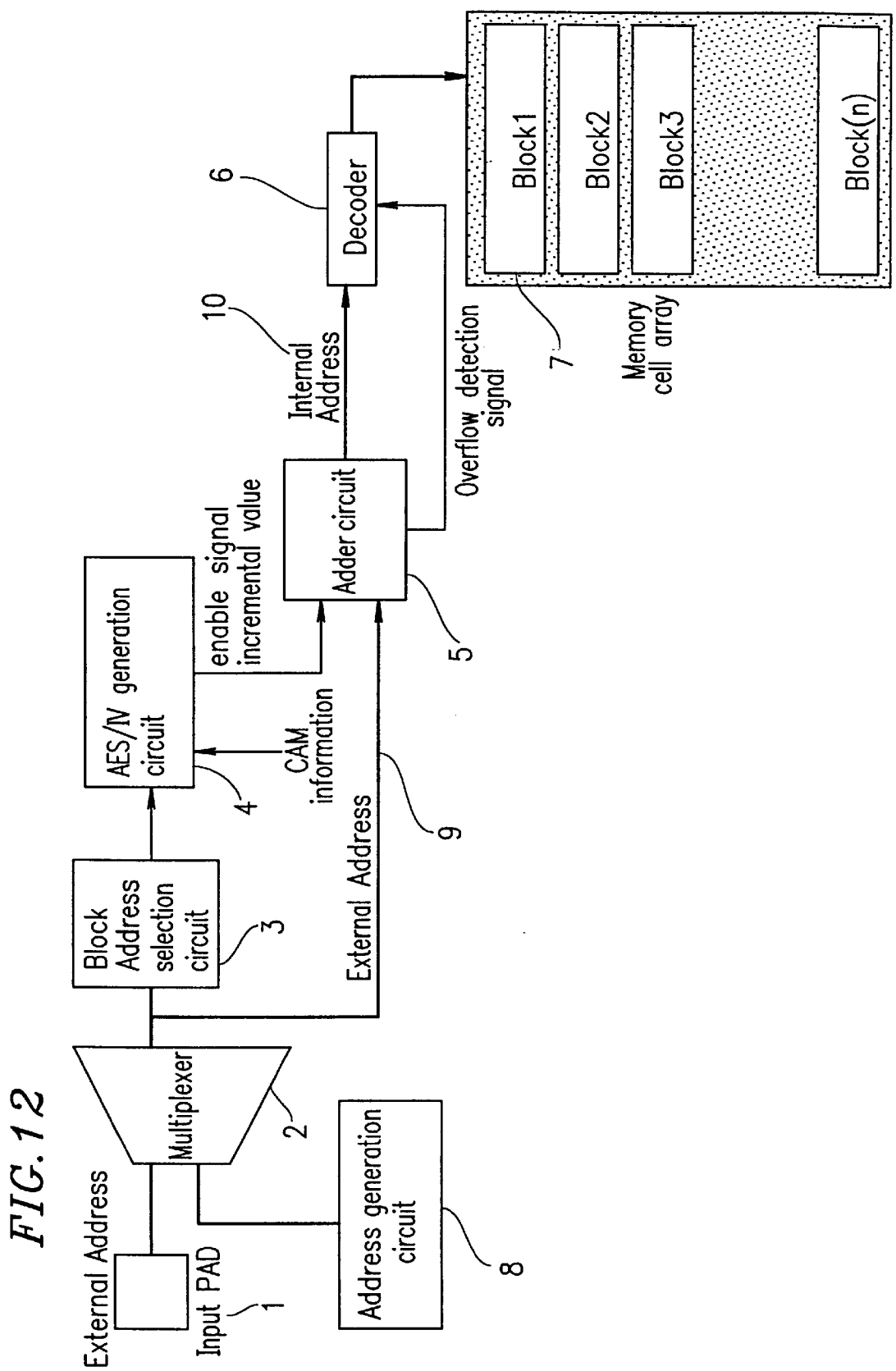
FIG. 12 is a block diagram illustrating a flow of addresses in a semiconductor memory device according to the present invention.

FIG. 12 is a block diagram illustrating a flow of addresses in the semiconductor memory device according to the present invention.

An external address is input via an input pad 1. In the case of a read operation, the address is transferred, via a multiplexer 2, as a signal to the subsequent stages. In the case of a program or erase operation, a command and address are input, in response to which an internal CPU (central processing unit; not shown) determines what operation is to be carried out. Then, an address which was latched at the time of receiving a command is issued, or an address determined by the CPU is generated. In a flash memory, such operation is generally realized by a control circuit which is generally called a write state machine. In the case of a program operation or an erase operation, an address thus generated in an address generation circuit 8 is transferred to the subsequent stages via the multiplexer 2.

The signal which is transferred via the multiplexer 2 is divided into a signal which is input to a block address selection circuit (decoder) 3 for determining which block the address belongs to, and a signal which is input to the adder circuit 5. If it is known from the previously-written CAM information that no defective blocks are present, then the signal which is input to the adder circuit 5 is passed, without being subjected to an incremental process, to a decoder 6 for selecting a memory cell, the corresponding memory cell is selected. If it is known from the previously-written CAM information that a defective block is present, an enable signal for enabling the adder circuit 5 and an incremental value, which are generated in an adder-circuit enable signal/incremental value generation circuit (hereinafter referred to as an "AES/IV generation circuit"), are supplied to the adder circuit 5. The adder circuit 5 sums the external address 9 and the incremental value, thereby generating an internal address 10. The internal address 10 is output from the adder circuit 5 to the memory cell array 7.

As described above, the address conversion means for converting an external address to an internal address can be realized by adapting the adder circuit 5 so as to operate only when the enable signal therefor is active. Alternatively, without even employing an enable signal, an external address may be selectively converted into an internal address as follows: when an external address is not to be converted, "0" may be used as an incremental value so that the internal address becomes identical with the external address (external address+"0"=internal address); otherwise a non-zero incremental value may be used to convert an external address into an internal address (external address+non-zero incremental value=internal address). Thus, the enable signal for the adder circuit may be omitted.

Furthermore, in the case where the external addresses overflow internal addresses after the incremental process performed by the adder circuit 5, as indicated by the generated internal address being identical to another internal address, an overflow detection circuit may generate an error (or an overflow detection signal), so as to prevent a corresponding memory cell in the memory cell array 7 from being selected.

In accordance with the semiconductor memory device of the present invention having the above structure, even if some defective bits (defective memory cells) are included, the semiconductor memory device can be utilized as a memory with a somewhat reduced capacity, with a minimum decrease in capacity. Thus, the normally-functioning bits left in the semiconductor memory device are taken full advantage of. Even if defective bits are present in discrete memory cell regions, a consecutive sequence of addresses appears to exist to any external devices that may be coupled to the semiconductor memory device, so that a normal access scheme can be used to access the semiconductor memory device according to the present invention.

Hereinafter, the present invention will be described by way of illustrative examples, with reference to the accompanying figures.

EXAMPLE 1

As Example 1 of the present invention, a 32 Mbit flash memory of a block configuration shown in FIG. 1. The illustrated flash memory is of a type which has gradually been becoming a mainstream in the field of flash memories in recent years, in which multiple banks are provided so as to be capable of simultaneous operation with one another (hereinafter such operation may be referred to as "dual work operation").

A flash memory having multiple banks provides the advantage of simultaneous operation between the respective banks. Since a flash memory typically requires a much longer time for an erase or program operation than a read operation, the multiple bank configuration, in which an erase or program operation may be performed to one bank while a read operation is performed to another bank, is gaining popularity.

The semiconductor memory device according to the present example of the invention is a 32 Mbit flash memory which includes a 12 Mbit large bank, a 4 Mbit small bank, and a 16 Mbit large bank. The 12 Mbit large bank and the 4 Mbit small bank together compose a left array (16 Mbits), whereas the 16 Mbit large bank composes a right array (16 Mbits). In such a flash memory, it is possible to perform different operations to the large banks and the small bank. For example, a read operation may be performed to the small bank while performing a program operation to the large banks.

Conventionally, there has been limited recourse for restoring a memory having multiple banks.

Hereinafter, it will be illustrated how various methods for restoring a multi-bank memory capable of dual work operation are possible according to the present invention. Although the following description primarily illustrates a method for reviving a 32 Mbit memory as a 16 Mbit memory, it is also possible to restore such a memory in smaller units, e.g., on a block-by-block basis, as described later.

Herein, it is assumed that the flash memory has an address structure consisting of a 6 bit block address, a 11 bit row address, and a 4 bit column address (totaling 21 bits), and that 16 bits of data can be input to or output from the flash memory at one time. The most significant bit of the block address is used to switch between the right and left 16 Mbit arrays. The other bits of the block address are used to select which block in the respective array.

If a defective bit is included in one of the large banks of this flash memory, it is necessary to leave at least one large bank as a normally-functioning region, in order to restore the flash memory as a normally-functioning 16 Mbit memory which is capable of dual work operation.

According to the present invention, if the right large bank includes a defective bit as shown in (a-1) of FIG. 1, the left large bank can be used as a normally-functioning region.

During an initial operation test, the locations of any defective addresses are confirmed, and CAM circuits are programmed with CAM data as necessary. If a block address pointing to the right large bank is input, the input buffer for the most significant bit is fixed based on the CAM data. As a result, only addresses pointing to the left large bank will be passed as internal addresses.

For example, as shown in (a-2) of FIG. 1, the most significant bit (A20) may be fixed to "H", thereby designating the right large bank to be an invalid region. As a result, a total of 16 Mbits, i.e., the left 12 Mbit large bank and the 4 Mbit small bank, can be saved.

In another case, where the left large bank includes a defective bit as shown in (b-1) of FIG. 1, the address may be switched to an address pointing to the right large bank only in response to a block address pointing to the left large bank.

In this case, the address for the small bank remains unchanged. Therefore, rather than fixing the input altogether, the most significant bit of the address needs to be changed only when an input (external) address points to the left large bank. For example, an input address and CAM data may be input to an XOR (exclusive OR) circuit having two inputs. The input address may be output as the internal address if the CAM data indicates "L", or a signal obtained by inverting the address data may be output as the internal address if the CAM data indicates "H". Since the determination as to whether an input address points to a large bank or a small bank can be easily made based on the block address, a circuit for determining a bank may be provided in the semiconductor memory device according to the present invention.

For example, as shown in (b-2) of FIG. 1, switching of a Z address may be programmed in the CAM circuits, so that the left large bank is switched or replaced with 12 Mbits of the right large bank. In addition, the most significant bit (A20) may be fixed to "H", and 4 Mbits in the right large bank may be designated as an invalid region based on CAM programming. Thus, a total of 16 Mbits, i.e., 12 Mbit in the right large bank and the 4 Mbit small bank, can be secured.

In this case, the lower 4 Mbits in the right large bank is regarded as a defective region. This region can be revived by employing an adder circuit in the manner described in Example 2 below.

In yet another case, where a defective region is present so as to be astride the left large bank and the small bank, as shown in (c-1) of FIG. 1, the semiconductor memory device can be still restored as a normally-functioning 16 Mbit memory.

In this case, the input buffer for the most significant bit of the block address may be fixed based on CAM data, so that if any address pointing to a region in the left side is input, that address may be converted to an internal address pointing to the right region.

For example, as shown in (c-2) of FIG. 1, the most significant bit (A20) of the block address may be fixed to "L", so as to designate the left region as an invalid region, leaving only the 16 Mbit right large bank to be viable.

Thus, according to the present example of the invention, a multi-bank flash memory capable of dual work operation which includes a defective memory cell can be restored as a normally-functioning memory.

In contrast, conventional methods do not support restoration of a multi-bank flash memory capable of dual work operation. For example, a block of 12 Mbits, which is not a value of 2 raised to the $n^{th}$ power (where n is any integer), cannot be restored by conventional methods.

Furthermore, even in the case of semiconductor memory devices not capable of dual work operation, such memories can only be restored up to a $\frac{1}{2}^n$ capacity according to conventional methods. The restorable capacity varies depending on the position of the defective bit, too. Therefore, blocks which are actually normally-functioning may not be restorable in some cases.

Figure 2:
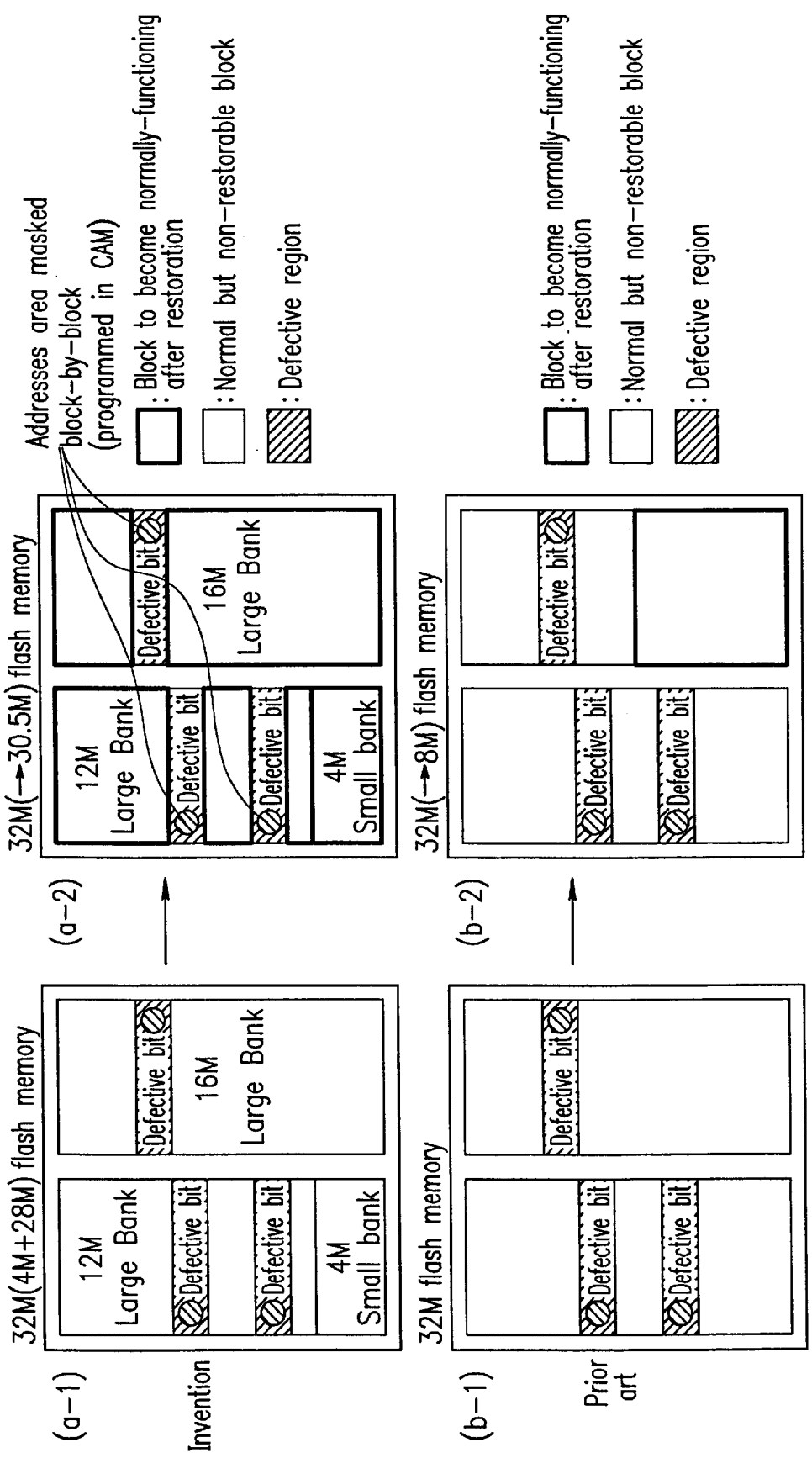
FIG. 2 is a block structure diagram of 32 Mbit flash memories of a type having two dual-work banks, and how such flash memories can be restored by a method according to an example of the present invention ((a-1) and (a-2)), or by a conventional method ((b-1) and (b-2)).

For example, as shown in (b-1) of FIG. 2, if defective bits are present in three blocks of a 32 Mbit flash memory, conventional methods can only restore a normally-functioning region up to 8 Mbits, as shown in (b-2) of FIG. 2.

On the other hand, according to the present invention, any normally-functioning region can be restored, thereby providing a flexible restoration means. For example, a flash memory having a block configuration can be flexibly restored on a block-by-block basis. In this case, data concerning the defective blocks may be written in CAM data, and if an input address points to those regions, the address may be masked in such a manner that such regions are not selected.

For example, as shown in (a-1) of FIG. 2, if defective bits are present in three blocks of a (4 Mbit+28 Mbit) flash memory in which each block has 512 Kbit capacity, up to a 30.5 Mbit normally-functioning region (26.5 Mbits [=28 Mbit large bank−3×0.5 Mbits]+4 Mbit small bank) can be restored, as shown in (a-2) of FIG. 2.

This principle will be described in more detail in Example 2 below.

EXAMPLE 2

Figure 3:
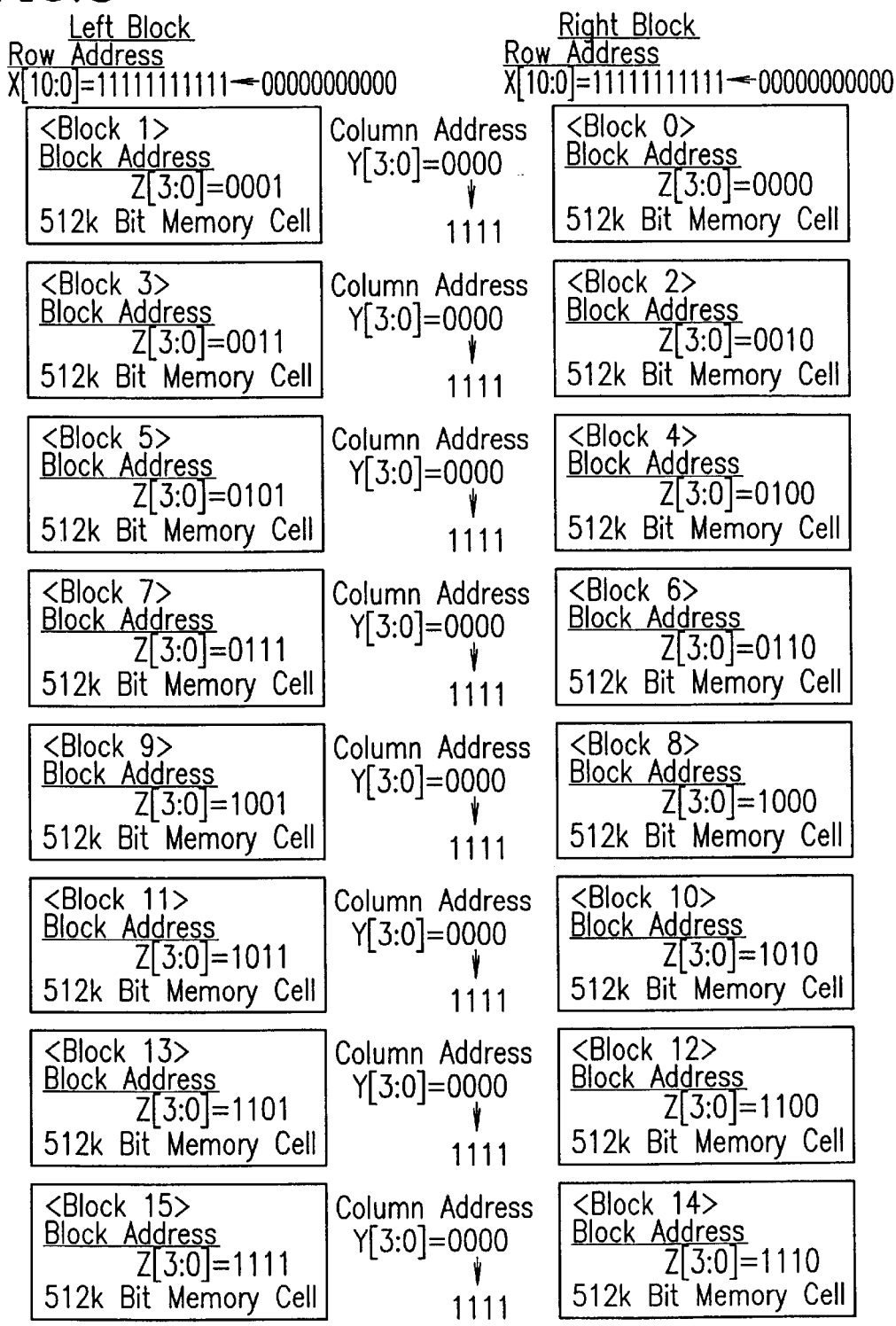
FIG. 3 is an address map showing a block structure of an 8 Mbit flash memory as applied to a method according to an example of the present invention.

According to t he present example of the invention, an 8 Mbit (16 bit I/O) flash memory having an address map as shown in FIG. 3 will be illustrated.

In general, addresses can generally be classified into three types: a row address (X address) for decoding a word line; a column address for decoding a bit line (Y address); and a block address for decoding a block (Z address).

The present example illustrates the case where the row address consists of 11 bits; the column address consists of 4 bits; and the block address consists of 19 bits.

It is assumed that the memory cells in the flash memory are arranged in a matrix configuration, with a plurality of word lines being provided in a row direction and a plurality of bit lines being provided in a column direction. The word lines associated with the memory cells are coupled to an X decoder (local X decoder), which is dedicated to each block. The word lines in each block are selected based on a combination of a row address and a block address in a block-by-block manner. Similarly, a Y decoder for column addresses and a Z decoder for block addresses are provided. Sixteen bits are used per instance of input/output.

Figure 13:
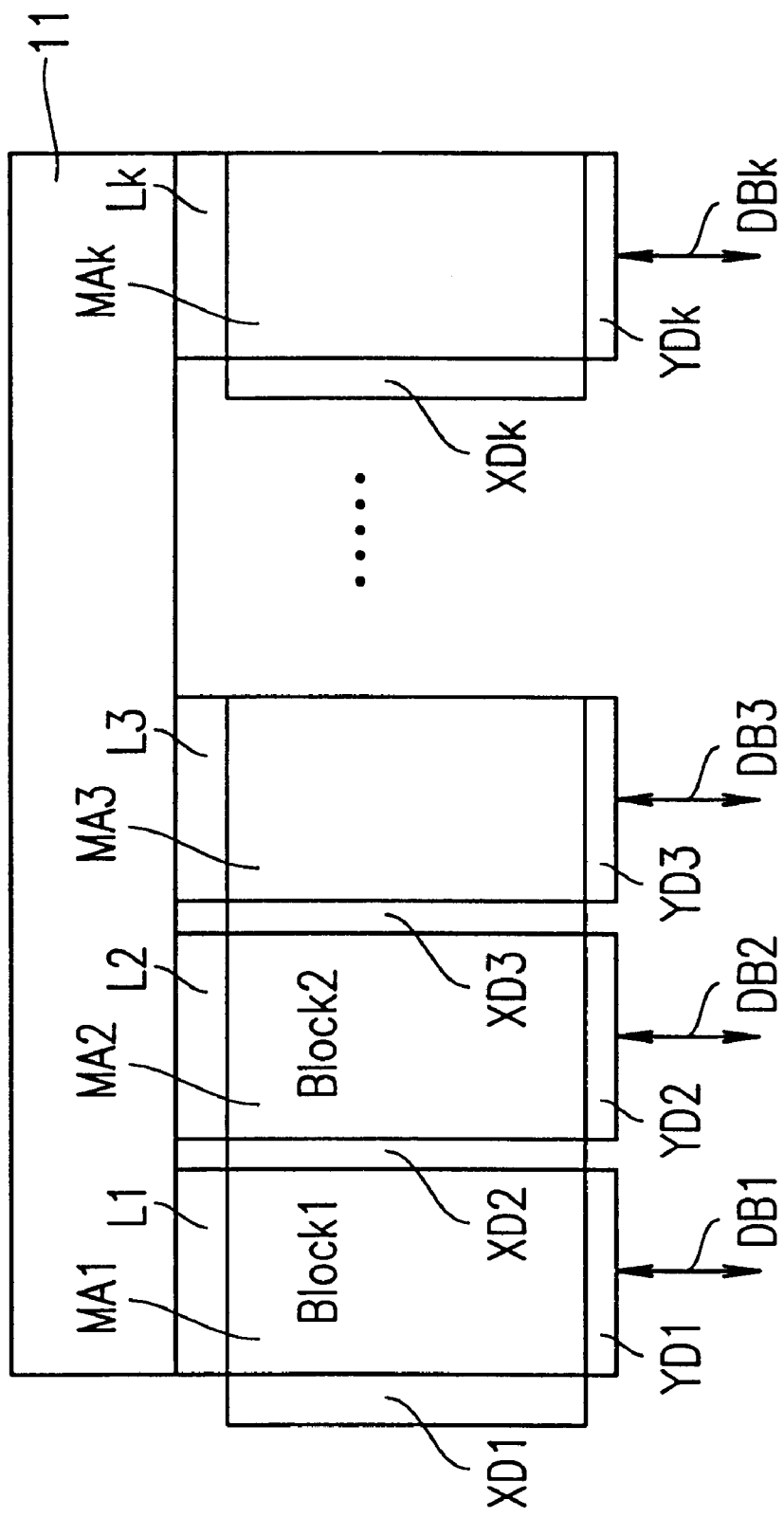
FIG. 13 is a schematic circuit diagram illustrating a non-volatile semiconductor memory device according to an example of the present invention.

FIG. 13 is a schematic circuit diagram illustrating a non-volatile semiconductor memory device (block erase type one chip flash memory) according to the present example of the invention.

A plurality of floating gate-type MOSs (metal oxide semiconductor) transistors are employed as non-volatile memory transistors. Each floating gate-type MOS has a floating gate. A writing operation thereto is performed via channel hot electron injection. An erase operation thereto is performed via tunnel erasure using a Fowler-Nordheim current.

In the non-volatile semiconductor memory device shown in FIG. 13, the plurality of floating gate-type MOS transistors are arranged in a matrix configuration. Control gates of the transistors in the same row are coupled in common to a word line. Drains of the transistors in the same column are coupled in common to a bit line. Sources of all of the transistors in the matrix are coupled to a common source.

The non-volatile semiconductor memory device includes memory cell array blocks $MA_1$, $MA_2$, ..., and $Ma_k$ (where k is a positive integer). Each memory cell array block $MA_1$, $MA_2$, ..., or $Ma_k$ includes a row decoder $XD_1$, $XD_2$, ..., or $XD_k$, and a column decoder $YD_1$, $YD_2$, ..., or $YD_k$, respectively. Each row decoder $XD_1$, $XD_2$, ..., or $XD_k$ outputs a predetermined word line selection signal in accordance with a signal value of a row selection signal portion of an input address signal at the time of a data program or data read. The outputs of the row decoder $XD_1$, $XD_2$, ..., or $XD_k$ are coupled to the word lines of each memory cell array block. In accordance with a signal value of a column selection signal portion of the input address signal, the column decoder $YD_1$, $YD_2$, ..., or $YD_k$ couples a selected bit line to a respective data bus $DB_1$, $DB_2$, ..., or $DB_k$. At the time of a data program, data read, or data erase, a predetermined voltage is selectively applied to the aforementioned common source. Specifically, a ground voltage GND may be applied at the time of a data program or data read, and a high voltage VHH may be applied at the time of a data erase, although the present invention is not limited thereto. For example, the present invention is also applicable to a configuration in which a word line selection signal having a negative voltage is applied to the control gate, and a ground voltage is applied to the common source, at the time of a data erase. A control section 11 controls the data program and data erase operations to each memory cell array block. Switching sections $L_1$, $L_2$, ..., $L_k$ selectively couple respective blocks to the control section 11 at the time of a data program or a block erase for each block.

In general, a flash memory performs an erase operation on a block-by-block basis in order to downsize the memory cell configuration. Accordingly, the present example illustrates a restoration method on a block-by-block basis.

FIG. 4A illustrates a case where all blocks in a 8 Mbit flash memory are normally-functioning, i.e., all memory cell regions are available. In this case, internal addresses are sequentially selected in response to external addresses. Thus, all blocks will be used.

FIG. 4B illustrates a case where a defective bit is included in one block. If the defective bit(s) included in one block cannot be replaced by reserve cells provided in the semiconductor memory device, the semiconductor memory device can still be restored as a memory in which all normally-functioning memory cell regions, i.e., those excluding the defective block, are available for use.

For example, if only Block 6 is defective, the semiconductor memory device can be utilized as a normally-functioning memory having a capacity of 7.5 Mbits (≈8 Mbits–512 Kbits). In this case, the addresses may not appear consecutive to external devices coupled to the semiconductor memory device. However, this problem can be effectively solved as follows.

As shown in FIG. 4B, the defective Block 6 would have a Z address "0110". If this address is input to a conventional semiconductor memory device, the defective Block 6 would be selected, thus resulting in an error.

In order to avoid the above problem, according to the present invention, if one block of defective memory cell region is present, any blocks having greater addresses than the address of the defective block will have their block addresses incremented by "+1", thereby generating their respective internal addresses. As a result, in response to an external consecutive sequence of addresses, the defective block is internally skipped so that only the normally-functioning blocks are accessed.

Specifically, if Block 6 happens to be defective, an adder circuit is employed to increment the addresses of Blocks 6 to Block 15 by "+1" based on the information concerning the defective Block 6. The defective block information and the incremental information (i.e., an incremental value of "+1") are stored in the non-volatile memory section. Since the actual internal addresses are not consecutive, it is necessary to shift the addresses (which is also true of the examples to follow).

Thus, in response to a consecutive sequence of addresses (7.5 Mbits) externally provided, the internal addresses will be automatically adapted. Thus, the semiconductor memory device can be utilized as a normally-functioning 7.5 Mbit semiconductor memory device, without making a user of the semiconductor memory device aware of the non-consecutive internal addresses.

In this case, there will be no internal address available corresponding to Block 15 in the external address. If Block 15 is externally selected, the Z address "1111" will be incremented by "+1" to give an internal Z address "10000", whose least significant 4 bits are "0000", identical to the internal address of Block 0. In order to avoid such an overflow of internal addresses, an overflow detection function is provided according to the present example of the invention. Specifically, if the incremental result should coincide with an existing internal address, an overflow is detected, in which case it is ensured that the indicated address is not selected. For example, a Z4 bit may be provided in the Z address, and an overflow may be detected if the Z4 bit becomes "1", in which case the memory cell region corresponding to that address will be rendered inaccessible.

Figure 5:
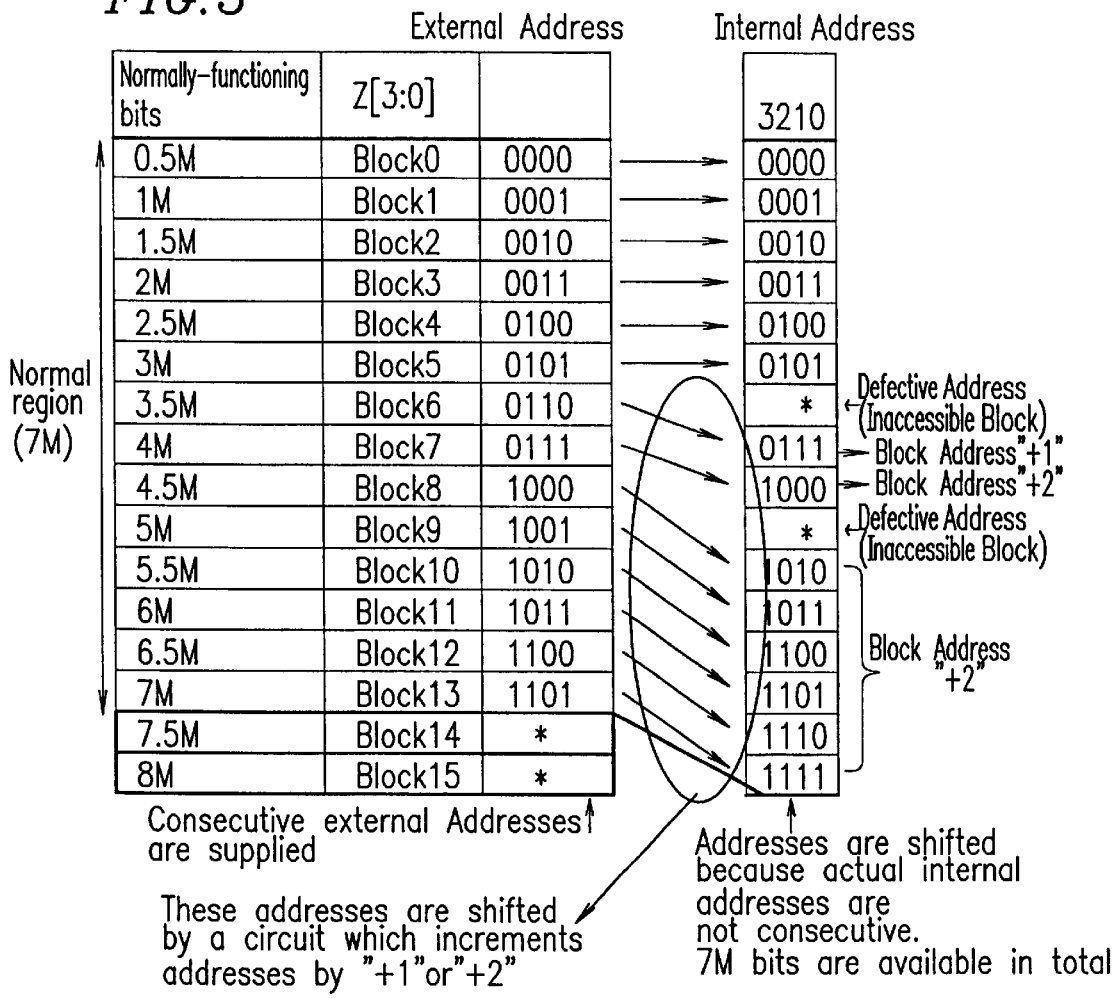
FIG. 5 is an address map showing a block structure of an 8 Mbit flash memory including defective bits in two blocks, and how the memory is restorable by a method according to an example of the present invention.

FIG. 5 is a diagram illustrating a block structure of an 8 Mbit flash memory, where defective bits are included in two blocks, in connection with the present example of the invention. In the case where defective bits are included in a plurality (e.g., two) of blocks, the address information associated with the defective blocks may be stored in the non-volatile memory section, and an adder circuit for adding an incremental value in the range from "+1" to "+15" to an input address in accordance with the address information may be used.

If Blocks 6 and 9 are defective, as shown in FIG. 5, identical external and internal addresses may be used up to Block 5, as in conventional methods. As for the defective Block 6, an external-provided block address is incremented by "+1" to generate an internal address such that Block 7 is selected instead. As for Block 7, an external-provided block address is incremented by "+1" to generate an internal address such that Block 8 is selected instead. As for Block 8, taking note of the fact that Block 9 is defective, an external-provided block address is incremented by "+2" to generate an internal address such that Block 10 is selected instead. As for Block 10 and subsequent blocks, an external-provided block address is incremented by "+2" to generate an internal address in order to account for the defective Blocks 6 and 9.

Since Blocks 6 and 9 are defective in the above example, the semiconductor memory device can be utilized as a normally-functioning memory having a capacity of 7 Mbits (=8 Mbits−0.5 Mbits×2). A consecutive sequence of 7 Mbits of addresses can be externally input to the semiconductor memory device in use.

Furthermore, address information associated with defective blocks, as well as incremental information concerning what level of increment is to be made to an input block address (including information indicating no increments to be made), may be stored in the non-volatile memory section for use.

In this case as well, there will be no internal address available corresponding to Blocks 14 and 15 in the external address. If Block 15 is externally selected, the internal address will effectively be identical to the internal address of another block. In order to avoid such an overflow of internal addresses, for example, a Z4 bit may be provided in the Z address, and an overflow may be detected if the Z4 bit becomes "1", in which case the memory cell region corresponding to that address will be rendered inaccessible.

In the above example, an 8 Mbit flash memory is illustrated as a specific example. Stated in more general terms, if a semiconductor memory device which has a total bit capacity of p Mbits and each block capacity of q Mbits includes defective bits in r blocks, the semiconductor memory device can be restored as a normally-functioning memory having (p−r×q) Mbits (where p, q, and r are positive integers). In such a case, the incremental value required for assigning external addresses to internal addresses are (p/q) in decimal expression. Furthermore, depending on the application, a narrower range of incremental values may be used in the adder circuit. For example, if the above-illustrated 8 Mbit semiconductor memory device is to be restored as a memory having a capacity of 1 Mbit or more (rather than as a 0.5 Mbit memory, which would not be very advantageous), the incremental value is reduced corresponding to one block. Accordingly, the incremental value in the adder circuit may be reduced by "1".

Although the above example illustrates a case where all blocks are of an equal 512 Kbit size, it is often the case that (as shown in FIG. 6A) some of the blocks are divided into smaller blocks, because 512 Kbit blocks may be too large, so that a plurality of blocks of different sizes are included in the memory, depending on the mode of use by each particular user. In such a case, block addresses alone do not suffice for decoding purposes, and therefore a lower address (e.g., column address) may also be utilized for addressing.

In such a configuration, as shown in FIG. 6B, if any defective bits are present in a region for which a column address is employed in an external address, the column addresses will be shifted so that the external addresses can be consecutively assigned to internal addresses of normally-functioning blocks.

Furthermore, in the case of a flash memory including a plurality of blocks having different capacities, as shown in FIG. 7, each given external address may be interpreted as pointing to a different block capacity, depending on whether the smaller capacity blocks reside at smaller external addresses (lower side) or greater external addresses (upper side), as is dictated by the mode of use by each particular user. In the example shown in FIG. 7, the smaller capacity blocks reside at the smaller external addresses.

In such a case, in general, the block address for internal addresses are converted by using a non-volatile memory section. Such a non-volatile memory section may be provided in addition to the non-volatile memory section used for storing information concerning defective memory cells. Alternatively, the latter non-volatile memory section may serve both functions.

For example, an input address and CAM data may be input to an XOR circuit having two inputs. The input address may be output as the internal address if the CAM data indicates "L", or a signal obtained by inverting the address data may be output as the internal address if the CAM data indicates "H". The use of the inverted address in the latter case (as shown in FIG. 7) makes it possible to support the mode of use by each particular user without necessitating a change in the internal block configuration. Thus, the present invention makes it possible to restore a semiconductor memory device as a normally-functioning memory device having a capacity in accordance with the defective regions, regardless of where the defects may be.

Figure 8:
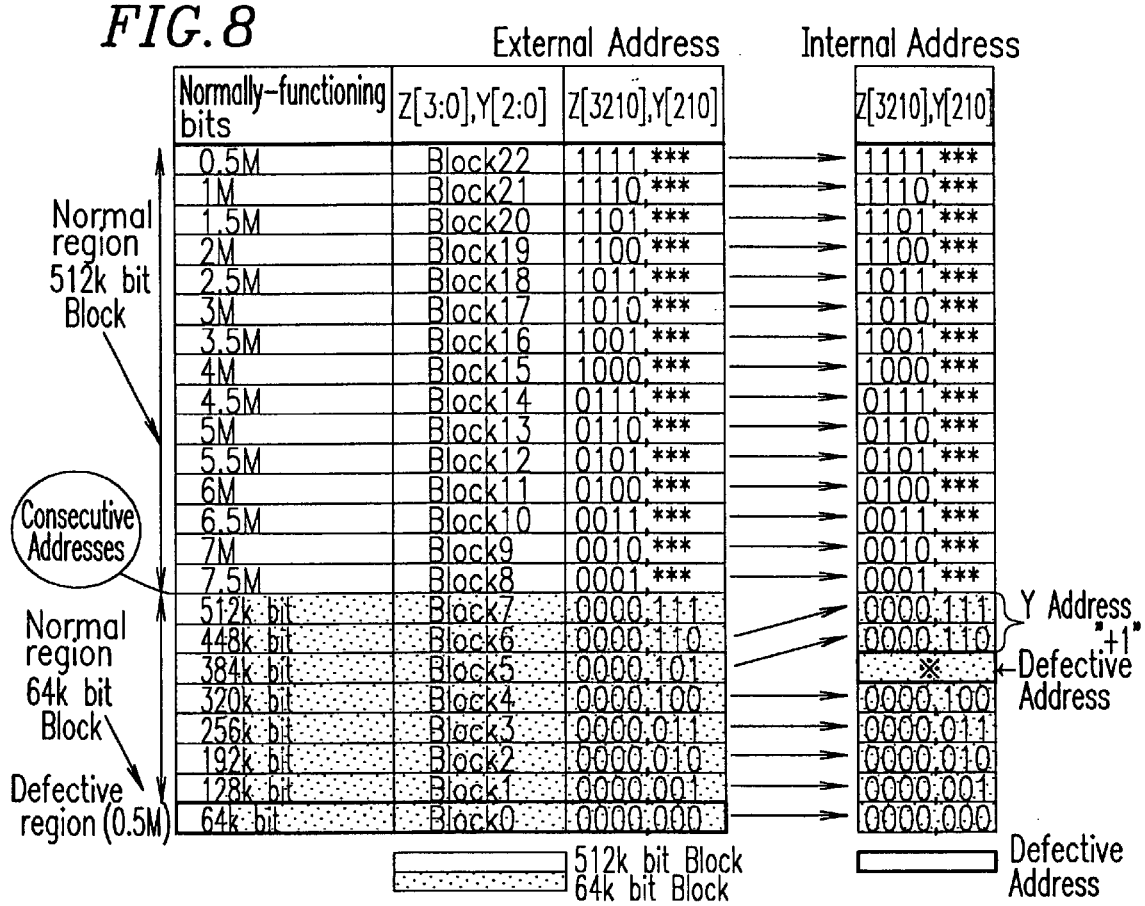
FIG. 8 is an address map showing a block structure of an 8 Mbit flash memory, including a plurality of blocks having different capacities, where one of the smaller capacity blocks residing at the smaller addresses includes a defective bit. This figure shows how the memory is restorable by a method according to an example of the present invention so as to obtain a consecutive transition in the addresses at the boundary from the smaller capacity blocks to the larger capacity blocks.
Figure 9:
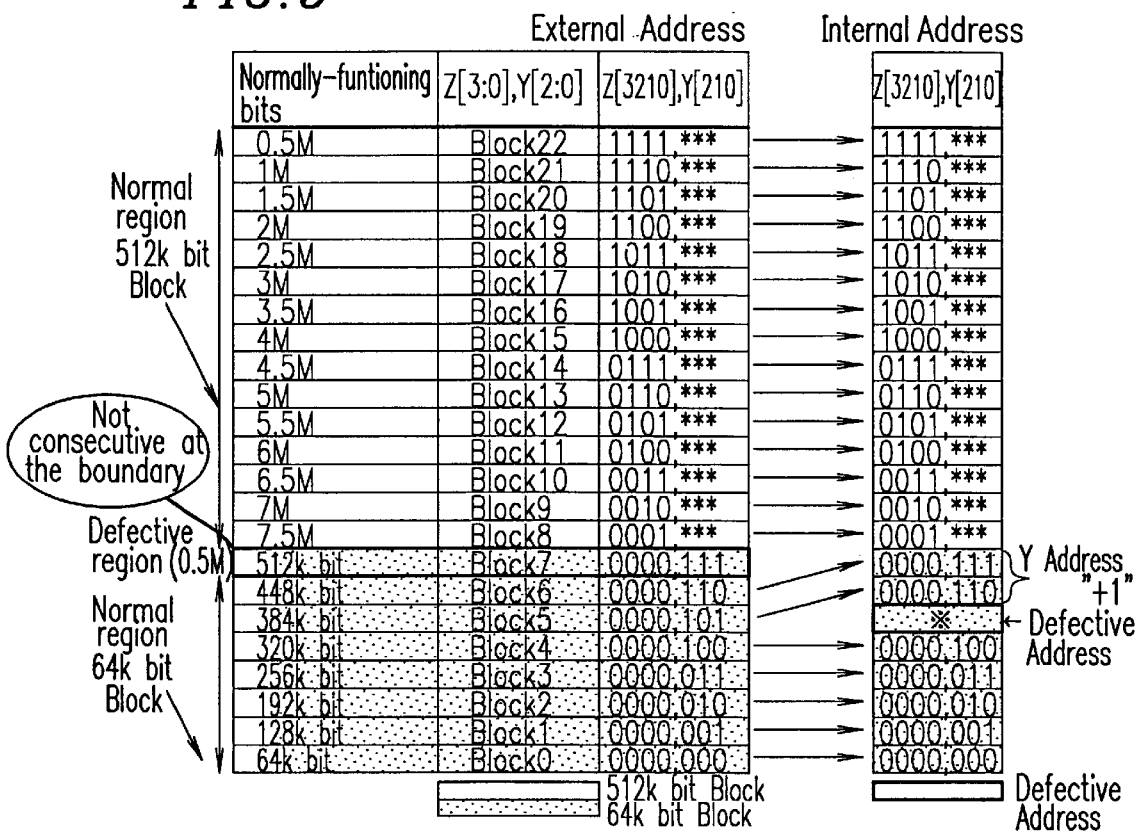
FIG. 9 is an address map showing a block structure of an 8 Mbit flash memory, including a plurality of blocks having different capacities, where one of the smaller capacity blocks residing at the smaller addresses includes a defective bit. This figure shows how the memory is restorable by a method according to an example of the present invention so as to obtain a non-consecutive transition in the addresses at the boundary from the smaller capacity blocks to the larger capacity blocks.

For example, referring to FIG. 8, suppose a semiconductor memory device including a plurality of blocks having different capacities, such that the smaller capacity blocks reside at smaller external addresses (lower side), includes a defective bit in one of the smaller blocks. Such a semiconductor memory device can be restored by only reviving the smaller capacity block, in such a manner that a consecutive sequence of addresses is strung through the smaller capacity blocks and another consecutive sequence of addresses is strung through the larger capacity blocks, with a consecutive transition in the addresses occurring at the boundary from the smaller capacity blocks to the larger capacity blocks. Alternatively, as shown in FIG. 9, the above semiconductor memory device can be restored in such a manner that a consecutive sequence of addresses is strung through the smaller capacity blocks and another consecutive sequence of addresses is strung through the larger capacity blocks, with a non-consecutive address transition occurring at the boundary from the smaller capacity blocks to the larger capacity blocks. Either one of the two modes of restoration can be easily realized in accordance with the mode use by each particular user, by providing either an adder circuit or a subtracter circuit for address conversion.

Although FIGS. 6(B), 8, and 9 illustrate cases where one block includes a defective memory cell, the same principle applies to the case where a number of blocks include a defective memory cell(s).

Furthermore, in addition to the block-by-block restoration as described above, multi-bank flash memories, which are gaining popularity, can also be restored according to the method of the present invention. Since such a multi-bank flash memory features dual work operation between the respective banks, it is not preferable to convert address across banks because doing so would result in changing the bank boundaries. Accordingly, in such cases, the addresses associated with defective blocks can be replaced within the boundary of each bank. As a result, the flash memory can be utilized as a smaller-capacity flash memory while conserving the dual work operation feature.

For example, in the case of an 8 Mbit flash memory including banks A and B, as shown in FIG. 10A, the relationship between the internal addresses and the external addresses may be changed between banks A and B, as shown in FIG. 10B. Thus, each bank A or B can be accordingly restored, so that a 7 Mbit memory cell region can be restored.

Furthermore, in the case where a problem occurring due to a defective block has an impact on only particular operation types and not the others, the semiconductor memory device can be restored as a normally-functioning memory which can accept a limited range of operation types. For example, consider a block which cannot accept an erase operation but does safely accept a program or read operation. According to the present invention, such a block may simply be designated as a defective block, or alternatively, as a block which can only accept any type of operation except an erase operation (e.g., as an OTP (One Time Protect) memory). Specifically, taking advantage of the fact that each block includes circuitry for realizing an erase operation for each block, a selection circuit for supplying power for performing an erase operation can be conveniently turned off. Similarly, in the case where a program operation is impossible and an erase operation and a read operation are still possible, such a semiconductor memory device can also be restored as a normally-functioning memory which can only accept a limited range of operation types.

Furthermore, there is a class of recent flash memories which include a separate OTP region in addition to memory cells contributing to the regular capacity. Since the OTP region is rarely exhausted in use, a portion of the OTP region can be utilized as the non-volatile memory section. For example, after power is supplied for the flash memory, the redundancy restoration data may alone be read to an internal register or the like, by using data in the OTP region.

It will be appreciated that, in any of the above examples, restoration is possible independent of the flash memory capacity, and any block capacity and/or bank configuration may be used. A non-volatile memory having any memory configuration can be restored. An erase operation can only be performed on a block-by-block basis in a flash memory, due to memory cell area constraints. However, memories in which it is possible to randomly perform an erase operation, a program operation, and a read operation, e.g., FRAMs, can be restored in smaller units than blocks. The present invention is also applicable to a volatile semiconductor memory device which includes a non-volatile memory region.

As described above, according to the present invention, data concerning defective memory cells may be stored, e.g., at the last step of a manufacture process for a semiconductor memory device, in a non-volatile memory section which is separately provided in addition to a regular memory cell section. Such data may be in the form of CAM data, for example. Thus, a defective memory cell region may be designated so as to only accept a limited range of operation types, or may be designated to be inaccessible to all operation types. As a result, even in the presence of defective memory cells, the normally-functioning bits can be made the most use of, so that the resultant semiconductor memory device can be utilized with a relatively small reduction in capacity.

Furthermore, by using an address conversion means, it is possible to assign a consecutive sequence of external addresses to internal addresses of normally-functioning memory cell regions. Even if defective bits are present in discrete memory cell regions, it is still possible to access the semiconductor memory device with a consecutive sequence of external addresses, so that a normal access scheme can be used to access the semiconductor memory device according to the present invention.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:
   a plurality of memory cell regions, each comprising at least one memory cell;
   a non-volatile memory section which accepts external writing; and
   unselecting means for designating at least one of the plurality of memory cell regions to be inaccessible based on data written to the non-volatile memory section,
   wherein at least one operation type is performed for at least one accessible memory cell region, which is not designated to be inaccessible, among the plurality of memory cell regions.

2. A semiconductor memory device according to claim 1, further comprising address conversion means for assigning a consecutive sequence of external addresses to the at least one accessible memory cell region.

3. A semiconductor memory device according to claim 2, wherein, if an internal address which is generated by adding a predetermined value to an external address coincides with an existing internal address when assigning the consecutive sequence of external addresses to the at least one accessible memory cell region, one of the plurality of memory cell regions corresponding to the generated internal address is designated to be inaccessible.

4. A semiconductor memory device according to claim 1, wherein, based on the data written to the non-volatile memory section, the unselecting means designates at least one of the plurality of memory cell regions to be inaccessible to one operation type among the at least one operation type, and yet accessible to the other operation types among the at least one operation type.

5. A semiconductor memory device according to claim 1,
   wherein the semiconductor memory device comprises a plurality of memory cell blocks capable of accepting a block erase operation, and
   wherein, when designating at least one of the plurality of memory cell regions to be inaccessible based on the data written to the non-volatile memory section, the unselecting means designates at least one of the plurality of memory cell blocks to be inaccessible.

6. A semiconductor memory device according to claim 5, wherein the plurality of memory cell blocks includes at least one memory cell block having a different capacity.

7. A semiconductor memory device according to claim 5,
wherein the semiconductor memory device comprises a plurality of banks, each comprising the plurality of memory cell blocks, such that the plurality of memory cell blocks are capable of dual work operation, and wherein, when designating at least one of the plurality of memory cell regions to be inaccessible based on the data written to the non-volatile memory section, the unselecting means designates at least one of the plurality of banks to be inaccessible.

8. A semiconductor memory device according to claim 7, wherein at least one of the plurality of banks includes at least one memory cell block having a different capacity.

9. A semiconductor memory device according to claim 6, wherein the address conversion means is capable of changing an address position of the at least one memory cell block having the different capacity.

10. A semiconductor memory device according to claim 1, wherein the non-volatile memory section is provided in a portion of a non-volatile memory cell which is capable of programming at once.

11. A method for restoring the semiconductor memory device according to claim 1 when the semiconductor memory device includes a defective memory cell, comprising the steps of:

storing an address of the defective memory cell in the non-volatile memory section; and designating, by means of the unselecting means, one of the plurality of memory cell regions that includes the defective memory cell to be inaccessible, based on the data written to the non-volatile memory section.

12. A method according to claim 11, further comprising the step of:

designating, by means of the unselecting means, one of the plurality of memory cell regions that includes the defective memory cell to be inaccessible only to an operation type which causes an error, based on the data written to the non-volatile memory section.

* * * * *

UNITED STATES PATENT AND TRADEMARK OFFICE
CERTIFICATE OF CORRECTION

PATENT NO.     : 6,400,602 B2  Page 1 of 1
DATED          : June 4, 2002
INVENTOR(S)    : Hidekazu Takata et al.

It is certified that error appears in the above-identified patent and that said Letters Patent is hereby corrected as shown below:

<u>Title page,</u>
Item [75], Inventors, please replace "Yasumichi Mori, Ikoma" with
-- Yasumichi Mori, Nara --;

<u>Column 1,</u>
Line 9, please replace "an FRAM" with -- a FRAM --";
Line 10, please replace "an MRAM" with -- a MRAM --;

<u>Column 3,</u>
Line 65, please replace "restorable as shown in a-2" with -- restorable as shown in c-2 --;

<u>Column 10,</u>
Line 51, please replace "normally-functioning region (26.5 Mbits" with
-- normally-functioning region (=26.5 Mbits --;

<u>Column 11,</u>
Lines 32 and 34, please replace "$Ma_\kappa$" with -- $MA_\kappa$ --;
Line 58, please replace "$L_1, L_2, ..., L_k$" with -- $L_1, L_2, ...,$ or $L_k$ --; and <u>Column 12,</u>
Line 12, please replace "7.5 Mbits ($\approx$8" with -- 7.5 Mbits (=8 --.

Signed and Sealed this

Twenty-ninth Day of October, 2002

Attest:

JAMES E. ROGAN
Attesting Officer    Director of the United States Patent and Trademark Office